(12) United States Patent
Deshpande et al.

(10) Patent No.: US 9,166,155 B2
(45) Date of Patent: Oct. 20, 2015

(54) METHOD OF MANUFACTURING A MAGNETORESISTIVE-BASED DEVICE

(71) Applicant: Everspin Technologies, Inc., Chandler, AZ (US)

(72) Inventors: Sarin A. Deshpande, Chandler, AZ (US); Sanjeev Aggarwal, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/264,520

(22) Filed: Apr. 29, 2014

(65) Prior Publication Data

US 2014/0315329 A1    Oct. 23, 2014

Related U.S. Application Data

(62) Division of application No. 13/830,082, filed on Mar. 14, 2013, now Pat. No. 8,747,680.

(60) Provisional application No. 61/682,860, filed on Aug. 14, 2012.

(51) Int. Cl.
*B44C 1/22* (2006.01)
*H01L 43/12* (2006.01)
*G11B 5/84* (2006.01)

(52) U.S. Cl.
CPC . *H01L 43/12* (2013.01); *G11B 5/84* (2013.01)

(58) Field of Classification Search
USPC .................................................. 216/22; 483/3
See application file for complete search history.

(56) References Cited

U.S. PATENT DOCUMENTS

| | | | |
|---|---|---|---|
| 6,829,162 B2 | 12/2004 | Hosotani | |
| 7,112,861 B2 | 9/2006 | Kanakasabapathy et al. | |
| 7,122,854 B2 | 10/2006 | Fukuzumi | |
| 8,119,424 B2 | 2/2012 | Mather et al. | |
| 8,133,745 B2 * | 3/2012 | Zhong et al. | 438/3 |
| 8,747,680 B1 | 6/2014 | Deshpande et al. | |
| 8,981,502 B2 | 3/2015 | Chen et al. | |
| 2002/0146851 A1 | 10/2002 | Okazawa et al. | |
| 2004/0063223 A1 | 4/2004 | Costrini et al. | |
| 2004/0150922 A1 | 8/2004 | Kagami et al. | |
| 2010/0020592 A1 | 1/2010 | Hosotani et al. | |
| 2010/0178714 A1 | 7/2010 | Cho et al. | |
| 2010/0304504 A1 | 12/2010 | Shinde et al. | |
| 2011/0235217 A1 | 9/2011 | Chen et al. | |
| 2013/0146997 A1 | 6/2013 | Lee et al. | |

OTHER PUBLICATIONS

International Search Report mailed Feb. 21, 2014 in PCT/US13/54904.

* cited by examiner

*Primary Examiner* — Roberts Culbert

(57) ABSTRACT

A method of manufacturing a magnetoresistive-based device having magnetic material layers formed between a first electrically conductive layer and a second electrically conductive layer, the magnetic materials layers including a tunnel barrier layer formed between a first magnetic materials layer and a second magnetic materials layer, including removing the first electrically conductive layer and the first magnetic materials layer unprotected by a first hard mask, to form a first electrode and a first magnetic materials, respectively; and removing the tunnel barrier layer, second magnetic materials layer, and second electrically conductive layer unprotected by the second hard mask to form a tunnel barrier, second magnetic materials, and a second electrode.

22 Claims, 8 Drawing Sheets

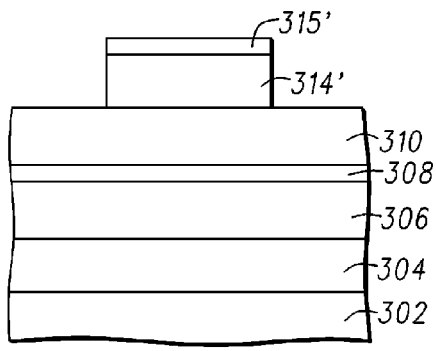
*FIGURE 3E* 300
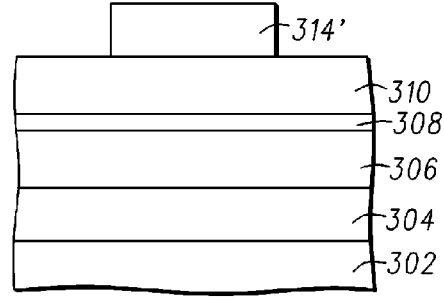
300 *FIGURE 3F*
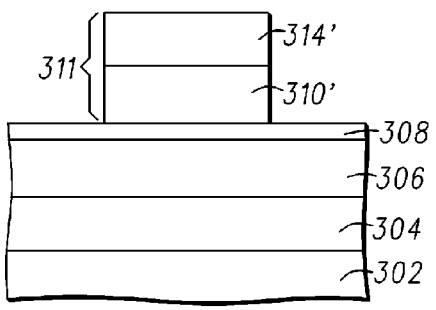
*FIGURE 3G* 300
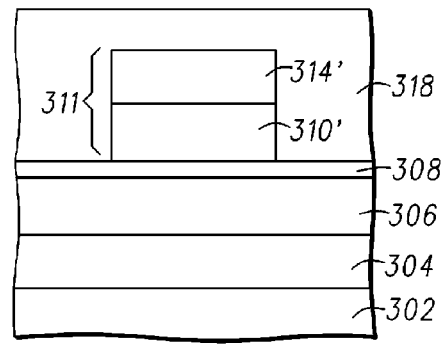
300 *FIGURE 3H*
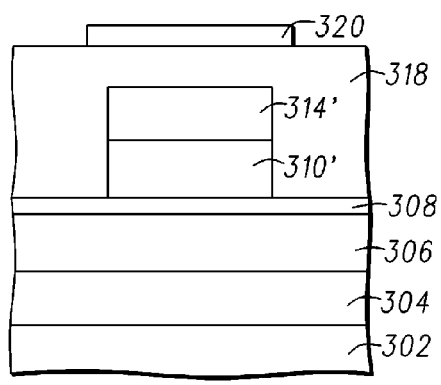
*FIGURE 3I* 300
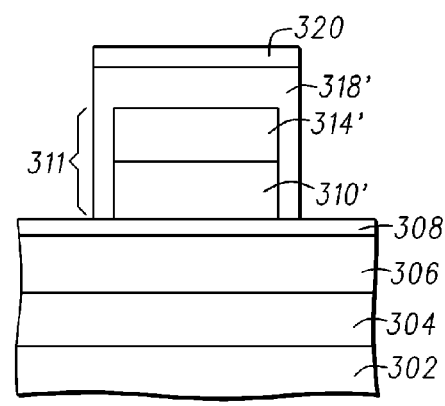
300 *FIGURE 3J*

METHOD OF MANUFACTURING A MAGNETORESISTIVE-BASED DEVICE

This application claims the benefit of U.S. patent application Ser. No. 13/830,082 filed Mar. 14, 2013 and U.S. Provisional Patent Application No. 61/682,860 filed Aug. 14, 2012.

TECHNICAL FIELD

The exemplary embodiments described herein relate generally to magnetoresistive-based devices and more particularly to a method of manufacturing a magnetoresistive-based device.

BACKGROUND

Magnetoresistive-based devices, spin electronic devices, and spintronic devices are synonymous terms for devices that make use of effects predominantly caused by electron spin. Magnetoresistive-based devices are used in numerous information devices to provide non-volatile, reliable, radiation resistant, and high-density data storage and retrieval. The numerous Magnetoresistive-based devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field-switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The spin angular momentum carried by the spin-polarized tunneling current causes reversal of the free layer, with the final state (parallel or antiparallel) determined by the polarity of the current pulse. The memory elements are programmed by the magnetic field created from current-carrying conductors. Typically, two current-carrying conductors, the "digit line" and the "bit line", are arranged in cross point matrix to provide magnetic fields for programming of the memory element. Because the digit line usually is formed underlying the memory element so that the memory element may be magnetically coupled to the digit line, the interconnect stack that couples the memory element to the transistor typically is formed, using standard CMOS processing, offset from the memory element.

Efforts have been ongoing to improve scaling, or density, of MTJ elements in an MRAM array. However, such efforts have included methods that use multiple masking and etching steps that consume valuable real estate in the MRAM device. Because an MRAM device may include millions of MTJ elements, such use of real estate in the formation of each MTJ element can result in a significant decrease in the density of the MRAM device.

Accordingly, there is a need for a method of manufacturing a magnetoresistive-based device including patterning a magnetoresistive-based device and an electrode coupled thereto. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

Methods are provided for manufacturing a magnetoresistive-based device using more than one hard mask.

In an exemplary embodiment, a method of manufacturing a magnetoresistive-based device having magnetic material layers formed over a first electrically conductive layer, the magnetic materials layers including a tunnel barrier layer formed between a first magnetic materials layer and a second magnetic materials layer, comprises patterning a first hard mask over the second magnetic materials layer; removing the second magnetic materials layer unprotected by the first hard mask, to form a second magnetic materials, respectively; patterning a second hard mask over the tunnel barrier layer, the first hard mask, and sides of the second magnetic materials; and removing the tunnel barrier layer and the first magnetic materials layer unprotected by the second hard mask to form a tunnel barrier and first magnetic materials.

In another exemplary embodiment, a method of manufacturing a magnetoresistive-based device having a magnetic material layer formed over a first electrically conductive layer, the magnetic materials layers including a tunnel barrier layer formed between a first magnetic materials layer and a second magnetic materials layer, comprises etching a portion of the second magnetic materials layer unprotected by a first hard mask to form a second magnetic materials, respectively; patterning a second hard mask over the tunnel barrier layer, the first hard mask, and sides of the second magnetic materials; and removing the tunnel barrier layer and the first magnetic materials layer unprotected by the second hard mask to form a tunnel barrier and second magnetic materials, wherein the first hard mask comprises a second electrode.

In yet another exemplary embodiment, a method of manufacturing a magnetoresistive-based device having magnetic materials layers formed between a first electrically conductive layer and a second electrically conductive layer, the magnetic materials layers having a tunnel barrier layer formed between a first magnetic materials layer and a second magnetic materials layer, comprises forming a first hard mask layer over the second electrically conductive layer; patterning a first photo resist over the first hard mask layer; etching the first hard mask layer resulting in a first hard mask between the first photo resist and the second electrically conductive layer; etching the second electrically conductive layer resulting in a second electrically conductive electrode between the first hard mask and the second magnetic materials layer; etching the second magnetic materials layer resulting in a second magnetic materials between the second electrically conductive electrode and the tunnel barrier layer, the first hard mask, the second electrically conductive electrode, and the second magnetic materials defining a side; depositing a second hard mask layer over the tunnel barrier layer, the first hard mask, and the side; patterning a second photo resist on the second hard mask and over the first hard mask layer; etching the second hard mask layer resulting in a second hard mask; etching the tunnel barrier layer resulting in a tunnel barrier between the second magnetic materials and the first magnetic materials layer; etching the first magnetic materials layer resulting in a first magnetic material between the tunnel barrier and the first electrically conductive layer; and etching the first electrically conductive layer resulting in a first electrode adjacent the first magnetic materials.

BRIEF DESCRIPTION OF THE DRAWINGS

The present invention will hereinafter be described in conjunction with the following drawing figures, wherein like numerals denote like elements.

DETAILED DESCRIPTION

Figure 1A:
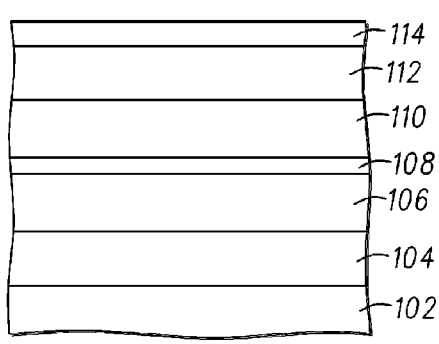
FIGS. 1A-1L are cross section diagrams of a semiconductor process in accordance with a first exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

During the course of this description, like numbers are used to identify like elements according to the different figures that illustrate the various exemplary embodiments.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photo resist material is applied onto a layer overlying a wafer substrate. A photo mask (containing clear and opaque areas) is used to selectively expose this photo resist material by a form of radiation, such as ultraviolet light, electrons, or x-rays. Either the photo resist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photo resist as a template.

There are many inventions described and illustrated herein, as well as many aspects and embodiments of those inventions. In one aspect, the present inventions relate to, among other things, methods of manufacturing a magnetoresistive-based device (for example, a magnetoresistive sensor or memory cell) having one or more electrically conductive electrodes or conductors (hereinafter, collectively "electrode") juxtaposed a magnetic material stack (for example, one or more layers of magnetic materials and one or more layers of one or more tunnel barriers). In one embodiment, the methods of manufacturing employ a plurality of hard masks (for example, two hard masks of the same or different types) to form, define and/or pattern a magnetic tunnel junction (MTJ) device having one or more electrically conductive electrodes and the magnetic material stack. Notably, the MTJ device may be, for example, a transducer (for example, electromagnetic sensor) and/or memory cell. As used herein, "hard" when used with "hard mask" means the ability to resist a particular etch.

In one embodiment, the hard masks (for example, metal and/or non-metal hard masks) may be relatively inert to the etch process of the electrically conductive material(s) and magnetic material during formation, definition and/or patterning of an electrically conductive electrode and magnetic material stack. For example, in one embodiment, a first hard mask (for example, a metal hard mask) may be employed to form, define and/or pattern a first portion of the MTJ device (for example, a first electrically conductive electrode and/or the magnetic material stack (or portion thereof). Such hard mask may include a selectivity, in connection with the etch processes (for example, chemical etch and/or mechanical etch processes), of the one or more layers of electrically conductive materials that is greater than or equal to 10:1 and, in a preferred embodiment, includes a selectivity that is greater than or equal to 20:1. The first hard mask may also include a selectivity in connection with the chemical etch and/or mechanical etch processes of the one or more layers of magnetic materials that is greater than or equal to 10:1 and, in a preferred embodiment, includes a selectivity that is greater than or equal to 20:1.

After forming, defining and/or patterning a first portion of the MTJ device (for example, a first electrically conductive electrode and/or the magnetic material stack (or portion thereof)), in one embodiment, a second hard mask (which may comprise the same or different types and/or materials as the first hard mask) may be employed to form, define and/or pattern a second portion of the MTJ device (for example, a second portion of the magnetic material stack and/or a second electrically conductive electrode). In this regard, a second hard mask is defined over the partially formed or etched MTJ device to facilitate suitable etching or formation of the second portion of the MTJ device. The second hard mask may be formed over and around the first portion of the MTJ device thereby protecting and/or isolating such first portion to the subsequent etch processes of the second portion of the MTJ device.

Notably, the manufacture of an MTJ device may employ more than two hard masks during the forming, defining and/or patterning a portion of the magnetic material stack of the MTJ device.

In one embodiment, the hard mask includes silicon oxide and/or silicon nitride (for example, having a thickness range of about 500-2500 Angstroms, and in a preferred embodiment, of about 1000-2000 Angstroms, and more preferred embodiment, of about 1250-1750 Angstroms). In addition thereto or in lieu thereof, the hard mask may include one or more noble metals and/or alloy thereof, for example, alloys of a noble metal with transition metals (for example, Platinum (Pt), Iridium (Ir), Molybdenum (Mo), Tungsten (W), Ruthenium (Ru) and/or alloy AB (where A=Pt, Ir, Mo, W, Ru and B=Iron (Fe), Ni, Manganese (Mn)). In this embodiment, the metal hard mask may include a thickness range of about 5-200 Angstroms, and in a preferred embodiment, of about 10-200 Angstroms, and more preferred embodiment, of about 20-100 Angstroms. For example, the metal mask may comprise PtMn or IrMn and include a thickness range of, for example, 15-150 Angstroms or 20-100 Angstroms.

Notably, in another embodiment, the hard mask, after formation, definition and/or patterning of the magnetic material stack, may be retained on or over the magnetic material stack and thereafter employed as the electrically conductive electrode (or a portion thereto). That is, after formation, definition and/or patterning of the electrically conductive electrode via etching of one or more layers of electrically conductive materials, the hard mask (which includes a metal or highly conductive material) is not removed but employed as the electrically conductive electrode (or portion thereof). In this embodiment, the material of the hard mask is sufficiently conductive to function as an electrically conductive electrode as well as sufficiently selective in connection with the etch processes (for example, chemical etch and/or mechanical etch processes) of the one or more layers of magnetic materials which form or define the magnetic material stack of the magnetoresistive-based device. For example, in one embodiment, the hard mask may comprise PtMn and/or IrMn— which are (i) electrically conductive alloys and (ii) relatively resistant to those certain etch processes of one or more layers of magnetic materials (for example, conventional fluorine and/or chlorine based etch processes) that form, define and/or provide the magnetic material stack materials of the magnetoresistive-based device.

In yet another aspect, the present inventions relate to a magnetoresistive-based device (for example, sensor or memory cell having one or more MTJ devices) and/or an array of magnetoresistive-based devices (for example, any array of sensors or memory cells, each having one or more MTJ devices) manufactured (in whole or in part) using any of the techniques described and/or illustrated herein.

With reference to FIG. 1A (a cross-sectional view of a partially formed magnetoresistive-based device disposed on a substrate 102), in one embodiment, a hard mask layer 114 is deposited, grown, sputtered and/or provided (hereinafter collectively "deposited" or various forms thereof (e.g., deposit or depositing)) on one or more layers 112 of electrically conductive materials of an MTJ device. The hard mask layer 114 may be deposited using any technique now known or later developed, for example, well known conventional techniques. In one embodiment, the hard mask layer 114 includes and/or consists of a silicon oxide, silicon nitride and/or a material that is relatively inert to or during the etch process of one or more layers of electrically conductive materials (which, after patterning form the electrically conductive electrode 112') and one or more layers 110 of magnetic materials (which, after patterning form the magnetic material stack 106'—see FIG. 1J). For example, in one embodiment, the hard mask layer 114 includes and/or consists of material having a selectivity in connection with the chemical etch and/or mechanical etch processes of the one or more layers of electrically conductive materials and/or magnetic materials that is greater than or equal to 10:1 and, in a preferred embodiment, includes a selectivity that is greater than or equal to 20:1.

In one embodiment, the hard mask layer 114 includes a silicon oxide and/or silicon nitride (for example, having a thickness of about 500-2500 Angstroms, in a preferred embodiment, having a thickness of about 1000-2000 Angstroms, and more preferred embodiment, having a thickness of about 1250-1750 Angstroms). In another embodiment, the hard mask layer 114 includes and/or consists of one or more noble metals and/or alloy thereof, for example, alloys of a noble metal with transition metals (for example, Pt, Ir, Mo, W, Ru and/or alloy AB (where A=Pt, Ir, Mo, W, Ru and B=Fe, Ni, Mn). In one embodiment, the metal hard mask layer 114 may include a thickness in the range of about 5-200 Angstroms, and in a preferred embodiment, in the range of about 10-150 Angstroms, and more preferred embodiment, in the range of about 20-100 Angstroms. For example, a metal hard mask layer 114 may be comprised of PtMn or IrMn and include a thickness range of, for example, 15-150 Angstroms or 25-100 Angstroms. This embodiment is discussed in more detail in connection with FIG. 3.

Figure 2A:
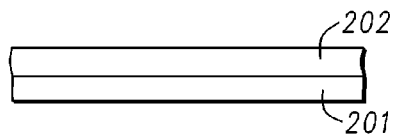
FIGS. 2A-2B are cross section diagrams of a semiconductor process in accordance with a second exemplary embodiment.

In yet another embodiment, the hard mask layer 114 includes silicon oxide and/or silicon nitride and one or more noble metals and/or alloy thereof, for example, alloys of a noble metal with the aforementioned transition metals. In this embodiment, it may be advantageous to dispose the non-metal material 202 (for example, silicon oxide and/or silicon nitride) on or over the one or more noble metals 201 and/or alloy thereof so that the major surface exposed to the etching process consists of silicon oxide and/or silicon nitride. (See FIG. 2A). For example, such a configuration may facilitate patterning of the photoresist in those situations where the metal presents too reflective a surface to suitably pattern the photoresist. Moreover, in this configuration, the metal material is protected from significant aspects of the etching processes and, as such, the integrity of the metal material is substantially maintained or preserved and the metal material may thereafter be employed as the electrode 112' or a portion thereof. Again, this embodiment is discussed in more detail in connection with FIG. 3.

Figure 1B:
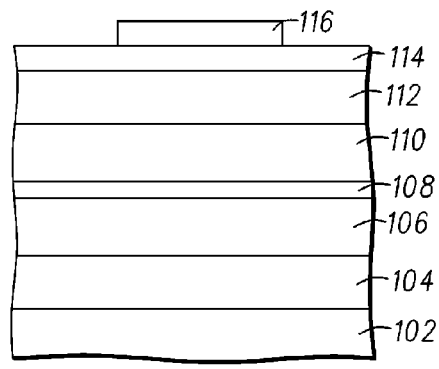
Figure 1C:
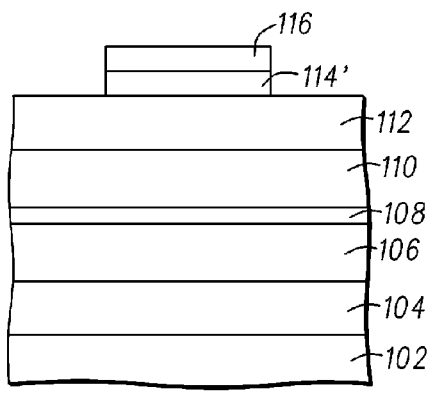
Figure 1D:
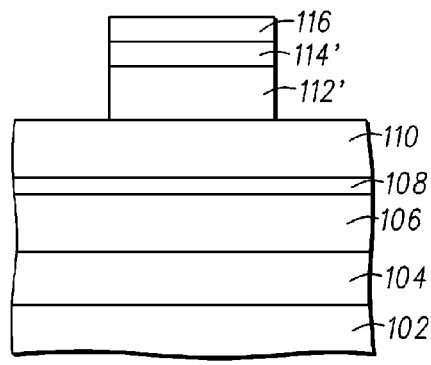

After deposition of the hard mask layer 114 (FIG. 1B), a photo resist 116 is deposited thereon and patterned to predetermined dimensions consistent with or correlated to selected dimensions of the electrically conductive electrode 112' to be formed (FIG. 1D). The photo resist 116 may be deposited and patterned using any technique now known or later developed, for example, well known conventional deposition and lithographic techniques.

Notably, after initially patterning the photo resist 116, it may be advantageous to "trim" the photoresist 116 and thereby adjust or shrink the size of at least a portion of the MTJ device 100 which is formed, defined and/or patterned using the hard mask 114. The trimming process may also provide pattern fidelity (uniform edges of the bit) in addition to increasing the aspect ratio and smoothness. The photo resist 116 may be trimmed using any technique now known or later developed, for example, well known conventional trimming techniques. In one embodiment, a trim process may employ O2 or Cl2/O2 (1:1) or CF4/O2 (1:1) gases to shrink the resist. It may be advantageous to adjust the ratio of the gases and process time to obtain the desired size. Notably, other gases may be substituted for Cl2 and CF4 such as CHF3, CH2F2, etc.

With reference to FIG. 1C, the hard mask layer 114 is then etched, for example, via mechanical etching (such as, for example, via sputter etching techniques) or chemical etching, to form or provide the first hard mask 114'. Notably, the hard mask layer 114 may be etched, formed and/or patterned using any etchants and/or technique now known or later developed—for example, using conventional etchants and techniques (for example, optical image end point techniques). It should be noted that the present inventions may employ any suitable materials and techniques, whether now known or later developed, to etch the hard mask layer 114 and thereby form, define and/or provide the hard mask 114'. In one embodiment, where the hard mask layer 114 includes a silicon oxide and/or silicon nitride (having a thickness of, for example, about 500 A-2500 A), the hard mask layer 114 may be etched using a chemical etch process with F2 containing gases like CF4, CHF3, CH2F2 or Cl2 and carrier gases such as Ar, Xe or a combination thereof. In another embodiment, where the hard mask layer 114 includes a metal (having a thickness of, for example, about 50 A-100 A), the hard mask layer 114 may be etched using sputter process with inert gases such as Xe, Ar, N2 O2 gases or a combination thereof.

After forming or patterning the hard mask 114' (having a predetermined pattern which is at least partially defined by the patterned photo resist 116), it may be advantageous to remove or strip the photo resist 116, for example, using conventional techniques. Here, by removing or stripping the photo resist 116 after the pattern is transferred to the hard mask layer 114, there is less likelihood that there will be loss of bit or cell pattern (and, for example, the high aspect ratio) due to a failure of the photo resist 116 (for example, a "collapse" of the photo resist 116) during subsequent processing.

With reference to FIG. 1D, one or more layers of electrically conductive layers 112 are then etched with the first hard mask 114' "protecting" certain portions thereof, to form, define, pattern and/or provide the electrically conductive electrode 112'. The one or more layers of electrically conductive layers 112 (for example, Tantalum (Ta), Tantalum-Nitride (TaN) or Ta—TaN composite) may be etched, formed and/or patterned using any etchants and/or technique now known or later developed—for example, using mechanical etchants and techniques (for example, sputter etchants and techniques) or chemical etching techniques. It should be noted that the present inventions may employ any suitable etchants and techniques (for example, CF4, CHF3, CH2F2 in combination with inert carrier gases such as Ar or Xe), whether now known or later developed, to etch the one or more layers 112 of electrically conductive materials and thereby form, define and/or provide the electrically conductive electrode 112'. Notably, in one embodiment, a Ta, TaN or Ta—TaN composite electrically conductive electrode 112' may include a thickness of about 50-1000 Angstroms.

Figure 1E:
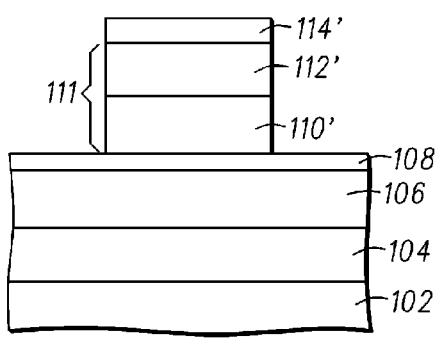

After etching the one or more layers 112 of electrically conductive materials and using the first hard mask 114' to "protect" the electrically conductive electrode 112', the one or more layers 110 of magnetic materials are etched to form, define, pattern and/or provide a first portion 111 of the MTJ device 100 (FIG. 1E). The one or more layers 110 of magnetic materials (for example, Nickel (Ni), Iron (Fe), Cobalt (Co), Palladium (Pd), Magnesium (Mg), Manganese (Mn) and alloys thereof) may be etched, formed and/or patterned using any etchants and/or technique now known or later developed—for example, using mechanical and/or chemical techniques (for example, a low bias power sputter technique or a chemical etch technique such as a conventional fluorine and/or chlorine based etch technique). Where the magnetic material stack 110' includes one or more synthetic antiferromagnetic structures (SAF) or synthetic ferromagnetic structures (SYF) (FIG. 2B, the one or more layers of magnetic materials layers 110 may also include one or more non-magnetic materials layers (204) (for example, Ruthenium (Ru), Copper (Cu), Aluminum (Al)). (See, FIG. 2B). Notably, one or more magnetic material stack 110' may include SAF and SYF structures, one or more layers 110 of magnetic materials 203, and other materials (including magnetic 203 and/or non-magnetic 204) now known or later developed. Such materials and/or structures may be arranged in any combination or permutation now known or later developed.

The etch process corresponding to the magnetic materials layers 110 of the first portion 111 of the MTJ device 100 (in this illustrative and exemplary embodiment, the magnetic materials layer(s) 110 disposed above the tunnel barrier layers) may be time controlled/monitored or endpoint controlled/monitored. In one embodiment, the etch process of magnetic materials layers 110 is stopped when the endpoint monitoring detects a predetermined material (for example, Magnesium (Mg) or Magnesium-Oxide (MgO)), for example, the material of the tunnel barrier 108, and/or the absence of a predetermined material. In one particular embodiment, the etch process stops on top of the tunnel barrier 108. Here, monitoring the endpoint for a rise in one or more of the tunnel barrier 108 material signals in the plasma based on optical emission spectra (OES). A drop or rise in the OES signal for the tunnel barrier 108 or magnetic material stack 110' above tunnel barrier 108 (immediately above or few layers above the tunnel barrier 108) may be monitored and, upon detection of signals corresponding to one or more tunnel barrier 108 material(s), the etch process is terminated.

In one embodiment, the etch process is controlled by the endpoint monitoring and an over etch (percentage of the endpoint time or a fixed time to end on the tunnel barrier 108). This control may be significant for the electrical performance of the MTJ device 100 which may be affected by oxidation of the tunnel barrier 108 due to an excessive over etch. For example, in one embodiment, a precise control may be achieved by having a relatively low sputter etch rate using Ar, Ar/O2, Xe, O2, or a combination of thereof, thereby providing an etch rate less than or equal to about 1 Angstrom/minute—and preferably, less than or equal to 0.75 Angstroms/minute, and more preferably, less than or equal to 0.5 Angstroms/minute.

Notably, the hard mask 114' and electrically conductive electrode 112' are relatively unaffected during definition and/or patterning the magnetic material stack 110'. Here, the hard mask 114' is relatively inert to such processing and the hard mask 114' "protects" the top surface of the electrically conductive electrode 112' (for example, particularly where such processing employs a mechanical etch technique—such as, low bias power sputter etch technique, due to the hard mask's sputter yield at those energies employed in connection with low bias power sputter etch technique).

In one embodiment, after formation, definition and/or patterning of the magnetic materials 110 of the first portion 111 of the MTJ device 100, the hard mask 114' may be removed or stripped using, for example, conventional techniques, to facilitate electrically contact to the exposed electrically conductive electrode. Indeed, after removing or stripping the metal hard mask 114', the exposed electrically conductive electrode 112' may be connected to sense, read and/or write conductors and the magnetoresistive-based device completed using any processes and/or structures now known or later developed. In another embodiment, the hard mask 114' is not removed or stripped but the MTJ device 100 may be completed as described immediately above. As described in more detail below, where the hard mask 114' comprises metal, the hard mask 114' (or portion thereof) may be patterned and employed as the electrically conductive electrode 112'.

Notably, after forming, defining and/or patterning a first portion of the MTJ device 100 (in this illustrative embodiment, an electrically conductive electrode 112' and a portion of the magnetic material layers 110 disposed on the tunnel barrier 108) and before depositing the second hard mask layer 118, it may be advantageous to "protect" the magnetic materials of the first portion 111 of the MTJ device 100 as well as the interface of such magnetic materials and tunnel barrier 108 from subsequent processing. In this regard, in one embodiment, an insulating material (not shown, for example, an aluminum oxide, magnesium oxide, titanium oxide, tantalum oxide, or any combination thereof) may be deposited or formed on the side walls of the magnetic materials of the first portion of the MTJ device 100 and/or exposed surfaces or edges of the tunnel barrier 108 using any technique and/or materials now known or later developed. For example, the materials and techniques described in U.S. Pat. No. 8,119,424 may be employed to protect the magnetic materials of the first portion of the MTJ device 100 and exposed surfaces or edges of the tunnel barrier 108 and thereby improve, maintain and/or enhance the integrity and/or uniformity (for example, across the MTJ device 100, the MTJ devices of the integrated circuit die and/or the MTJ devices of the integrated circuit dice of the wafer) of the physical and/or electrical characteristics of the magnetic materials of the first portion 111 of the MTJ device 100 and certain portions of the tunnel barrier 108 in light of subsequent processing.

Figure 1F:
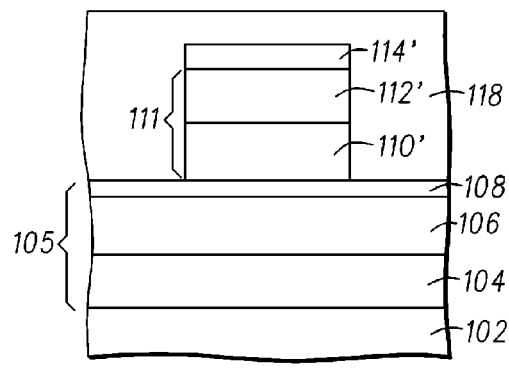
Figure 1G:
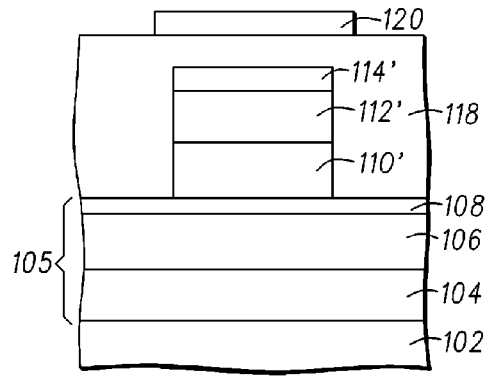
Figure 1H:
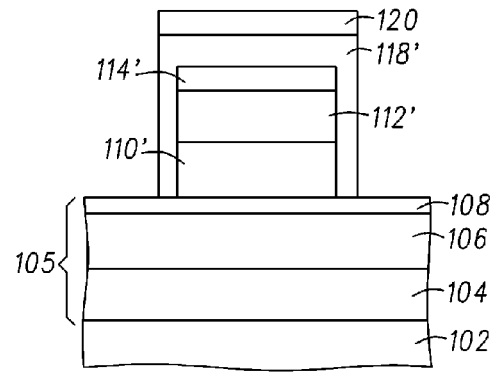

With reference to FIGS. 1F-1H, after forming, defining and/or patterning a first portion 111 of the MTJ device 100, a second hard mask 118' may be employed to form, define and/or pattern a second portion 105 of the MTJ device (for example, a second portion 105 of the magnetic material stack 106 and/or a second electrically conductive electrode 104'). In this regard, a second hard mask 118' is defined over the partially formed or etched MTJ device 100 to facilitate suitable etching or formation of the second portion 105 of the MTJ device 100. The second hard mask 118' may be formed over and around the first portion 111 of the MTJ device 100 thereby protecting such first portion 111 to the subsequent etch processes of the second portion 105 of the MTJ device 100.

To that end, in one embodiment, a second hard mask layer 118 is deposited, grown, sputtered and/or provided (hereinafter collectively "deposited" or various forms thereof (e.g., deposit or depositing)) on and over the first portion 111 of the MTJ device 100 and on the tunnel barrier 108 of an MTJ device. The second hard mask layer 118 may be deposited using any technique now known or later developed, for example, well known conventional techniques. In one embodiment, the hard mask layer 118 includes and/or consists of a silicon oxide, silicon nitride and/or a material that is relatively inert to or during the etch process of one or more layers 104 of electrically conductive materials (which, after patterning form the electrically conductive electrode 104') and one or more layers 106 of magnetic materials (which, after patterning form the magnetic material stack 106' of the second portion 105 of the MTJ device 100).

The second hard mask layer 118 may include and/or consist of material having a selectivity in connection with the chemical etch and/or mechanical etch processes of the one or more layers of electrically conductive materials and/or magnetic materials that is greater than or equal to 10:1 and, in a preferred embodiment, includes a selectivity that is greater than or equal to 20:1. For example, in one embodiment, the hard mask layer 118 includes a silicon oxide and/or silicon nitride (for example, having a thickness of about 500-2500 Angstroms, in a preferred embodiment, having a thickness of about 1000-2000 Angstroms, and more preferred embodiment, having a thickness of about 1250-1750 Angstroms).

In another embodiment, the hard mask layer 118 may be a combination of a silicon oxide (for example, provided using tetraethylorthosilicate (TEOS)) and aluminum, magnesium, titanium, tantalum, or any combination thereof. In this embodiment, after deposition of the aluminum, magnesium, titanium, tantalum, or any combination thereof, the silicon oxide is deposited, for example using TEOS whereby oxygen is absorbed by the aluminum, magnesium, titanium, tantalum, or any combination thereof to from an aluminum oxide, magnesium oxide, titanium oxide, tantalum oxide, or any combination thereof, respectively, layer beneath the silicon oxide. As noted above, this material may be useful in "protecting" the side walls of the magnetic materials of the first portion 111 of the MTJ device 100 and/or exposed surfaces or edges of the tunnel barrier 108 during subsequent processing to form the MTJ device 100. As noted above, the techniques described in U.S. Pat. No. 8,119,424 may be employed to improve, maintain and/or enhance the integrity and/or uniformity of the physical and/or electrical characteristics of the magnetic materials of the MTJ device 100 in light of subsequent processing (for example, the etching processes to form the second portion 105 of the MTJ device 100).

After deposition of the second hard mask layer 118, a photo resist 120 is deposited thereon and patterned to predetermined dimensions consistent with or correlated to selected dimensions of the second portion 105 of the MTJ device 100 to be formed (FIG. 1G). The photo resist 120 may be deposited and patterned using any technique now known or later developed, for example, well known conventional deposition and lithographic techniques. As noted above, after initially patterning the photo resist 120, it may be advantageous to "trim" the photoresist 120 and thereby adjust or shrink the size of at least a portion of the MTJ device 100 which is formed, defined and/or patterned using the hard mask 118'. The trimming process may also provide pattern fidelity (uniform edges of the bit) in addition to increasing the aspect ratio. The photo resist 120 may be trimmed using any technique now known or later developed, for example, well known conventional trimming techniques.

With reference to FIG. 1H, the second hard mask layer 118 is then etched, for example, via chemical etching (for example, using chemical etch process with gases CF4, CHF3, CH2F2 and carrier gases such as Ar and Xe), to form or provide the second hard mask 118'. Notably, the second hard mask layer 118 may be etched, formed and/or patterned using any etchants and/or technique now known or later developed—for example, using conventional etchants and techniques (for example, optical image end point techniques). It should be noted that the present inventions may employ any suitable materials and techniques, whether now known or later developed, to etch the second hard mask layer 118 and thereby form, define and/or provide the second hard mask 118'.

In one embodiment, the second hard mask 118' is defined over and on the partially formed or etched MTJ device 100 (in this illustrative example, the first portion 111 of the MTJ device 100) to facilitate suitable etching or formation of the second portion 105 of the MTJ device 100. The second hard mask 118' may be formed over and around the first portion 111 of the MTJ device 100 thereby protecting such first portion 111 to the subsequent etch processes that form, define and/or pattern the second portion 105 of the MTJ device 100.

After forming or patterning the second hard mask 118' (having a predetermined pattern which is at least partially defined by the patterned photo resist 120), it may be advantageous to remove or strip the photo resist 120, for example, using conventional techniques. Here, by removing or stripping the photo resist 120 after the pattern is transferred to the hard mask layer 118, there is less likelihood that there will be loss of bit or cell pattern (and, for example, the high aspect ratio) due to a failure of the photo resist 120 (for example, a "collapse" of the photo resist 120) during subsequent processing.

Figure 1I:
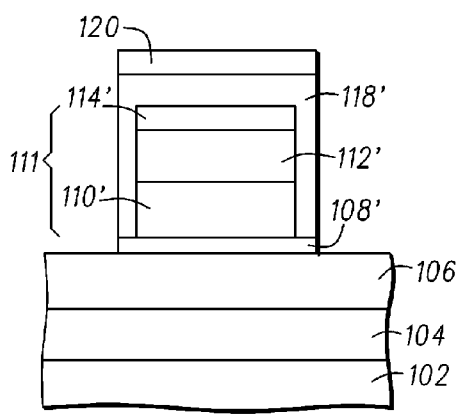

With reference to FIGS. 1H and 1I, the tunnel barrier layer(s) 108 are then etched with the second hard mask 118' "protecting" portions of the first portion 111 of the MTJ device 100 to form, define, pattern and/or provide the tunnel barrier 108'. The tunnel barrier layer(s) 108 (for example, Mg or MgO) may be etched and/or patterned using any etchants and/or technique now known or later developed—for example, using mechanical etchants and techniques (for example, sputter etchants and techniques). It should be noted that the present inventions may employ any suitable etchants and techniques, whether now known or later developed, to etch the one or more layers of electrically conductive materials and thereby form, define and/or provide the tunnel barrier 108'.

Figure 1J:
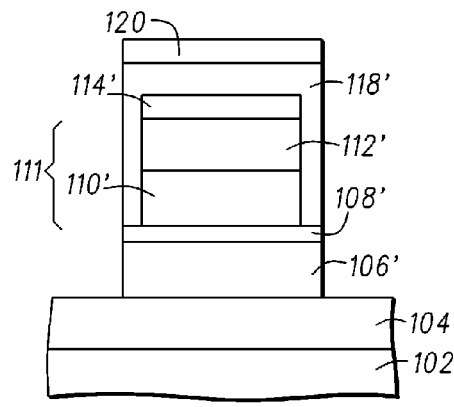
Figure 2B:
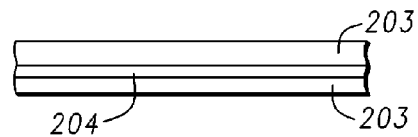

Thereafter, the one or more layers 106 of magnetic materials are etched to form, define, pattern and/or provide a second magnetic materials 106' of the MTJ device 100 (FIG. 1J). The one or more layers 106 of magnetic materials (for example, Ni, Fe, Co, Pd, Mg, Mn and alloys thereof) may be etched, formed and/or patterned using any etchants and/or technique now known or later developed—for example, using mechanical and/or chemical techniques (for example, a low bias power sputter technique or a chemical etch technique such as a conventional fluorine and/or chlorine based etch technique). As stated above, the one or more layers 106 of magnetic materials may include one or more synthetic antiferromagnetic structures (SAF) or synthetic ferromagnetic structures (SYF), the one or more layers 106 of magnetic materials layers may also include one or more non-magnetic materials layers (for example, ruthenium, copper, aluminum) (FIG. 2B). Notably, one or more magnetic material stack may include SAF and SYF structures, one or more layers of magnetic materials, and other materials (including magnetic and/or non-magnetic) now known or later developed. Such materials and/or structures may be arranged in any combination or permutation now known or later developed.

The etch process corresponding to the magnetic materials layers 106 of the second portion of the MTJ device 100 may be time controlled/monitored or endpoint controlled/monitored. In one embodiment, the etch process of magnetic materials layers 106 is stopped when the endpoint monitoring detects a predetermined material, combination of materials and/or percentages. That is, the etch process terminates or stops on top of the electrically conductive layer(s) 104.

Similar to the process described above in relation to U.S. Pat. No. 8,119,424, after the second magnetic materials 106' of the MTJ device 100 is formed, defined, patterned and/or provided, the second magnetic materials 106' of the MTJ device may be "isolated" or "protected" via an oxygen plasma which oxidizes any magnetic material remaining in the field on top of the tunnel barrier 108' to form a non-magnetic insulating oxide. This insulating oxide also protect the second magnetic materials 106' and thereby improve, maintain and/or enhance the integrity and/or uniformity of the physical and/or electrical characteristics of the second magnetic materials 106' of the MTJ device 100 during the etch process of the electrically conductive layer(s) 104 to form, define and/or pattern the bottom electrically conductive electrode 104'. Notably, the isolation and/or protection layer on the tunnel barrier 108' and magnetic materials 106' of the second portion 105 of the MTJ device 100 may facilitate or allow etching processes that employ more "corrosive" gases like Cl2, BCl3, HCl, Br2, HBr, BBr3 (and carrier gases such as Ar, Xe and N2) to etch the bottom electrode 104'.

Figure 1K:
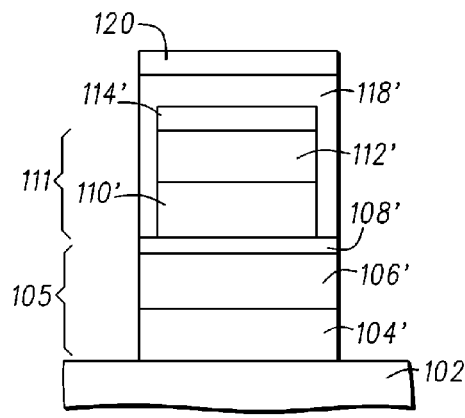

With reference to FIGS. 1J and 1K, the one or more layers 104 of electrically conductive materials are then etched to form, define, pattern and/or provide the electrically conductive electrode 104' of the second portion of the MTJ device 100—which, in this illustrative embodiment, is the bottom electrode 104' of the MTJ device 100. The one or more layers 104 of electrically conductive materials (for example, Ta, TaN or Ta—TaN composite) may be etched, formed and/or patterned using any etchants and/or technique now known or later developed—for example, using chemical etchants and techniques (for example, chemical etch process with gases Cl2, BCl3, HCl, Br2, HBr and/or BBr3 and carrier gases such as Ar, Xe and N2). It should be noted that the present inventions may employ any suitable etchants and techniques, whether now known or later developed, to etch the one or more layers of electrically conductive materials 104 and thereby form, define and/or provide the electrically conductive electrode 104'. Notably, in one embodiment, a Ta, TaN or Ta—TaN composite electrically conductive electrode 104' may include a thickness of about 50-1000 Angstroms.

Figure 1L:
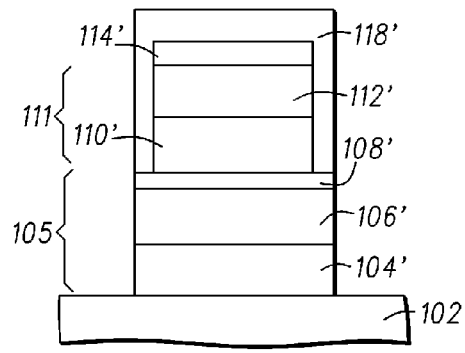

With reference to FIGS. 1K and 1L, in the event that the photo resist 120 used to define or pattern the second hard mask 118' is not removed earlier, after forming or patterning the electrically conductive electrode 104' of the second portion 105 of the MTJ device 100, the photo resist 120 may be removed or stripped, for example, using conventional techniques. Indeed, any technique now known or later developed may be employed to remove or strip the photo resist 120.

As discussed above, in another embodiment, the first hard mask 114' may be a metal hard mask. In this embodiment, metal hard mask 114', after formation, definition and/or patterning, may serve as both the mask and the electrically conductive electrode (or a portion thereto). For example, with reference to FIG. 3A (a cross-sectional view of a partially formed magnetoresistive-based device 300), in one embodiment, one or more layers 314 of metal materials are deposited on one or more layers 310 of magnetic materials. The one or more layers 314 of metal materials include and/or consist of one or more materials that are relatively inert to or during the etch process of one or more layers of magnetic materials (which, after patterning form the magnetic material stack 310). For example, in one embodiment, the one or more layers 314 of metal materials include and/or consist of materials having a selectivity in connection with the chemical etch and/or mechanical etch processes of the one or more layers of magnetic materials that is greater than or equal to 10:1 and, in a preferred embodiment, includes a selectivity that is greater than or equal to 20:1.

The one or more layers 314 of metal materials may include and/or consist of one or more noble metals and/or alloy thereof, for example, alloys of a noble metal with transition metals (for example, Pt, Ir, Mo, W, Ru and/or alloy AB (where A=Pt, Ir, Mo, W, Ru and B=Fe, Ni, Mn). Further, in one embodiment, one or more layers 314 of metal materials may include a thickness in the range of about 50-300 Angstroms, and in a preferred embodiment, in the range of about 75-250 Angstroms, and more preferred embodiment, in the range of about 100-200 Angstroms. For example, the one or more layers 314 of metal materials may be comprised of PtMn or IrMn and include a thickness range of, for example, 75-250 Angstroms or 100-200 Angstroms.

After deposition of the one or more layers 314 of metal materials, it may be advantageous to deposit photo-pattern assist layer 315 to facilitate patterning of the photoresist 316 in those situations where the metal presents too reflective a surface to suitably pattern the photoresist. In one embodiment, the photo-pattern assist layer 315 may be a silicon oxide (for example, PECVD or CVD techniques using tetraethylorthosilicate (TEOS)) or a silicon nitride. In this way, the photoresist 316 may be readily patterned on the metal hard mask 314'.

Figure 3A:
FIGS. 3A-3N are cross section diagrams of a semiconductor process in accordance with a third exemplary embodiment.
Figure 3B:
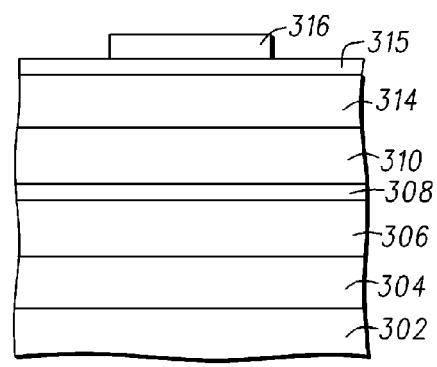

After deposition of the one or more layers 314 of metal materials, a photo resist 316 is deposited and patterned to predetermined dimensions consistent with or correlated to selected dimensions of the electrically conductive electrode to be formed (FIG. 3B). Similar to the embodiments illustrated in FIG. 1, the photo resist 316 may be deposited and patterned using any technique now known or later developed, for example, well known conventional deposition and lithographic techniques.

Also, as noted above, after initially patterning the photo resist 316, it may be advantageous to "trim" the photoresist 316 and thereby adjust or shrink the size of at least a portion of the MTJ device 300 which is formed, defined and/or patterned using the hard mask 314'. The trimming process may also provide pattern fidelity (uniform edges of the bit) in addition to increasing the aspect ratio and smoothness. The photo resist 316 may be trimmed using any technique now known or later developed, for example, well known conventional trimming techniques. In one embodiment, a trim process may employ O2 or Cl2/O2 (1:1) or CF4/O2 (1:1) gases to shrink the photo resist 316. It may be advantageous to adjust the ratio of the gases and process time to obtain the desired size. Notably, other gases may be substituted for Cl2 and CF4 such as CHF3, CH2F2, etc.

Figure 3C:
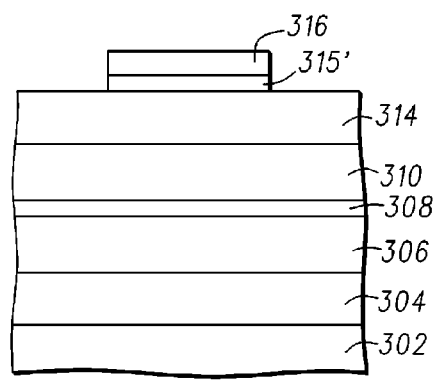

With reference to FIG. 3C, in one embodiment, the photo-pattern assist layer 315 is etched using the patterned photoresist 316. In one embodiment, the photo-pattern assist layer 315 may etched using a chemical etch process with F2 containing gases like CF4, CHF3, CH2F2 or Cl2 and carrier gases such as Ar, Xe or a combination thereof. Indeed, the patterned photo-resist 316 may be etched or removed using any technique now known or later developed.

Figure 3D:
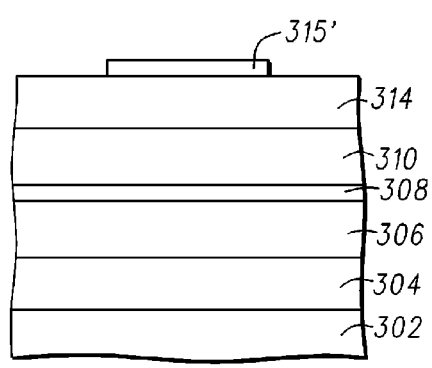
Figure 3K:
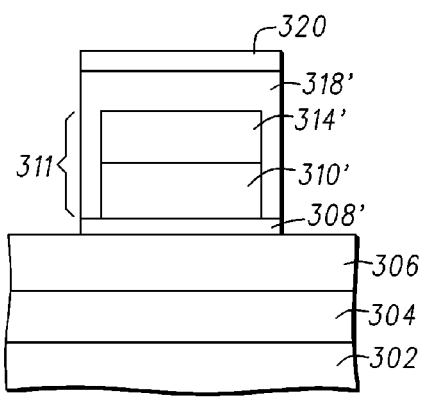
Figure 3L:
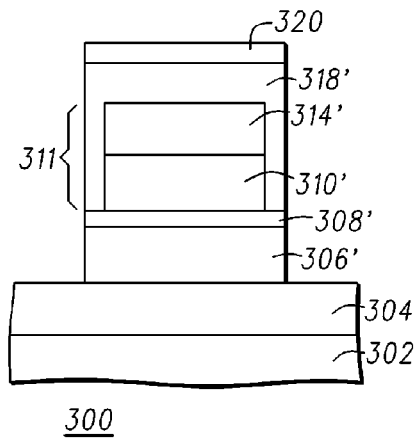
Figure 3M:
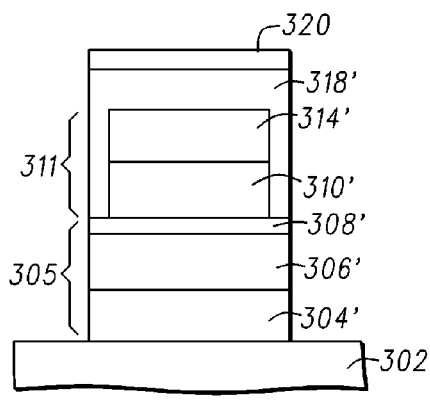
Figure 3N:
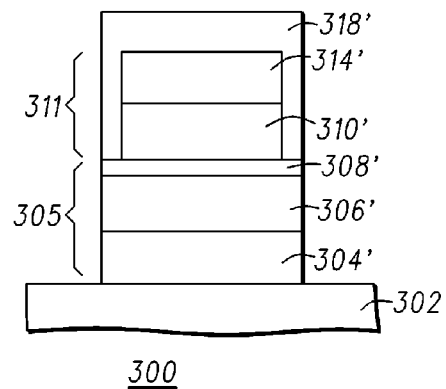

In one embodiment, the patterned photo-resist 316' is stripped or removed and the metal hard mask 314'—electrically conductive electrode 314' is etched, formed and/or patterned using the photo-pattern assist layer 315' as a mask (FIGS. 3D and 3E). Here, the metal hard mask layer 314 is etched, for example, via mechanical etching (such as, for example, via sputter etching techniques) to form or provide the first hard mask 314'. Notably, the metal hard mask layer 314 may be etched, formed and/or patterned using any etchants and/or technique now known or later developed—for example, using conventional etchants and techniques (for example, optical image end point techniques). It should be noted that the present inventions may employ any suitable materials and techniques, whether now known or later developed, to etch the metal hard mask layer 314 and thereby form, define and/or provide the metal hard mask 314'. In one embodiment, where the metal hard mask layer 314 includes a thickness of, for example, about 50 A-100 A, the hard mask layer 314 may be etched using sputter process with inert gases such as Xe, Ar, N2 O2 gases or a combination thereof.

After forming the metal hard mask 314'—electrically conductive electrode 314' (having a predetermined pattern which is at least partially defined by the patterned photo resist 316 and the photo-pattern assist layer 315'), it may be advantageous to remove or strip the photo pattern assist layer 315', for example, using conventional techniques (FIG. 3F). Here, by removing or stripping the photo-pattern assist layer 315' after the pattern is transferred to the metal hard mask layer 314, there is less likelihood that there will be loss of bit or cell pattern (and, for example, the high aspect ratio) due to a failure of the photo resist 316 (for example, a "collapse" of the photo resist 316) during subsequent processing.

With reference to FIGS. 3F and 3G, using the metal hard mask 314'—electrically conductive electrode 314', the one or more layers 310 of magnetic materials are etched to form, define, pattern and/or provide a first portion 311 of the MTJ device 300 in a manner similar to that discussed above in connection with FIG. 1E. Here, the one or more layers 310 of magnetic materials (for example, Ni, Fe, Co, Pd, Mg, Mn and alloys thereof) may be etched, formed and/or patterned using any etchants and/or technique now known or later developed—for example, using mechanical and/or chemical techniques (for example, a low bias power sputter technique or a chemical etch technique such as a conventional fluorine and/or chlorine based etch technique). Where the magnetic material stack 310' includes one or more synthetic antiferromagnetic structures (SAF) or synthetic ferromagnetic structures (SYF), the one or more layers 310 of magnetic materials layers may also include one or more non-magnetic materials layers (for example, ruthenium, copper, aluminum) (FIG. 2B). Notably, one or more magnetic material stack 310' may include SAF and SYF structures, one or more layers 310 of magnetic materials, and other materials (including magnetic and/or non-magnetic) now known or later developed. Such materials and/or structures may be arranged in any combination or permutation now known or later developed.

As noted above, the etch process corresponding to the magnetic materials layers 310 of the first portion of the MTJ device (in this illustrative and exemplary embodiment, the magnetic materials layer(s) 310 disposed above the tunnel barrier layers 308) may be time controlled/monitored or endpoint controlled/monitored. In one embodiment, the etch process of magnetic materials layers 310 is stopped when the endpoint monitoring detects a predetermined material (for example, Mg or MgO), for example, the material of the tunnel barrier layer 308, and/or the absence of a predetermined material. In one particular embodiment, the etch process stops on top of the tunnel barrier layer 308. Here, monitoring the endpoint for an increase or decrease in one or more of the tunnel barrier layer 308 material signals in the plasma based on optical emission spectra (OES). An increase or decrease in the OES signal for the tunnel barrier layer 308 or magnetic stack layer 310 above tunnel barrier 308 (immediately above or few layers above the tunnel barrier 308) may be detected/monitored and, upon detection of signals corresponding to one or more tunnel barrier 308 material(s), the etch process is terminated.

In one embodiment, the etch process is controlled by the endpoint monitoring and an over etch (percentage of the endpoint time or a fixed time to end on the tunnel barrier 308). This control may be significant for the electrical performance of the MTJ device 300 which may be affected by oxidation of the tunnel barrier 308 due to an excessive overetch. For example, in one embodiment, control may be achieved by having a low sputter etch rate using Ar, Ar/O2, Xe, O2, or a combination of thereof, thereby providing an etch rate less than or equal to about 1 Angstrom/minute—and preferably, less than or equal to 0.75 Angstroms/minute and, more preferably, less than or equal to 0.5 Angstroms/minute.

With reference to FIGS. 3H-3N, the remaining portion of the MTJ device 300 may be manufactured in the same manner as described above in connection with FIGS. 1F-1L. For the sake of brevity the discussion will not be repeated.

Notably, in this embodiment, the material(s) of the metal hard mask 314'—electrically conductive electrode 314' are relatively unaffected during formation, definition and/or patterning the magnetic material stack 310'. Here, the metal hard mask 314'—electrically conductive electrode 314' is relatively inert to such processing and "protects" selected portions of the one or more layers 310 of magnetic materials, particularly where such processing employs a mechanical etch technique—such as, low bias power sputter etch technique, due to the metal hard mask's sputter yield at those energies employed in connection with low bias power sputter etch technique.

Moreover, after formation, definition and/or patterning of the magnetic material stack 310', the resultant structure is an electrically conductive electrode 314' disposed on or over the magnetic material 310 of the first portion 311 of the MTJ device 300 (FIG. 3G). Thus, in this embodiment, after formation, definition and/or patterning of the magnetic material stack 310', the metal hard mask 314'—electrically conductive electrode 314' is not removed or stripped and the exposed portions thereof may be connected to an electrical conductor (sense, read and/or write conductors) and the magnetoresistive-based device completed using any processes and/or structures now known or later developed.

Thus, in this embodiment, the materials of the metal hard mask 314'—electrically conductive electrode 314' are sufficiently conductive to function as an electrically conductive electrode as well as sufficiently selective in connection with the etch processes (for example, chemical etch and/or mechanical etch processes) of the one or more the layers 310 of magnetic materials which form or define the magnetic material stack 310' of the magnetoresistive-based device 300. For example, in one embodiment, the metal hard mask 314'—electrically conductive electrode 314' may comprise PtMn and/or IrMn—which are (i) electrically conductive alloys and (ii) relatively resistant to those certain etch processes of one or more layers of magnetic materials (for example, conventional fluorine and/or chlorine based etch processes) that form, define and/or provide the magnetic material stack 310' materials of the magnetoresistive-based device 300.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Figure 4A:
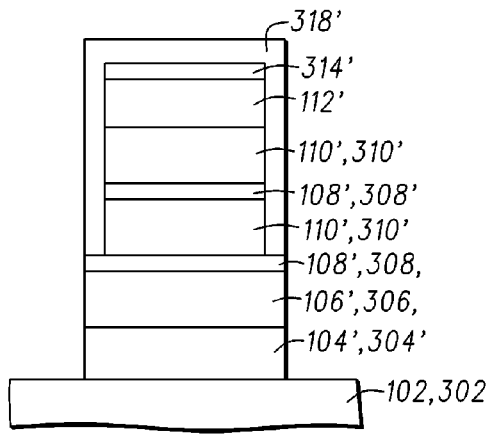
FIGS. 4A-4D are cross section diagrams of a semiconductor process in accordance with a fourth exemplary embodiment.
Figure 4B:
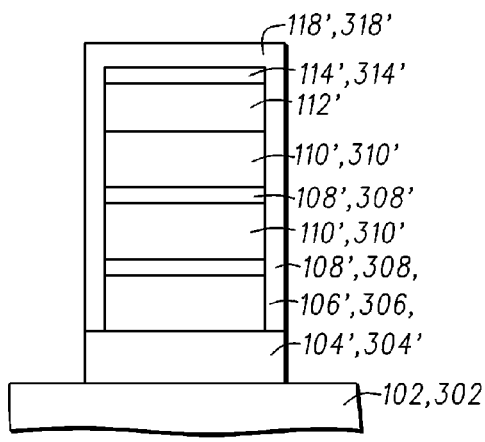

For example, although the present inventions have been described and illustrated as employing the second hard mask 118', 318' after etching through the magnetic materials layer(s) 110, 310 (FIGS. 1E and 3G) and before etching the tunnel barrier layer(s) 108, 308, the manufacturing techniques of the present inventions may employ a second hard mask 118', 318' after etching the tunnel barrier layer(s) 108, 308 and thereby forming the tunnel barrier 108', 308'. (See, for example, FIGS. 4A and 4B). Note there are two tunnel barriers 108', 308', both positioned between magnetic materials 110', 310'.

Figure 4C:
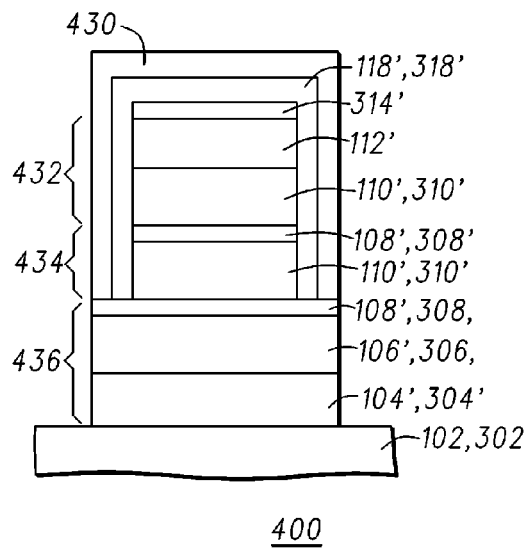
Figure 4D:
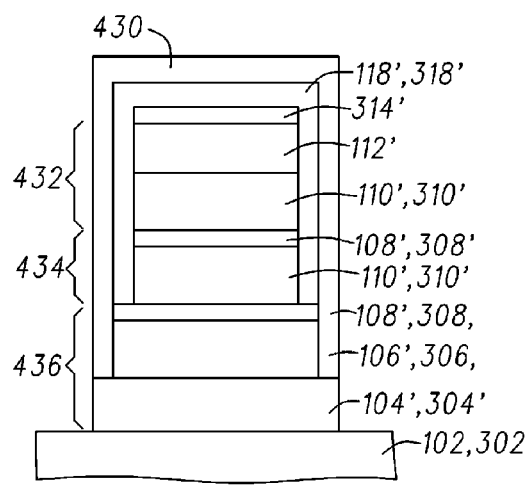

Further, although the present inventions have been illustrated as employing only two hard masks, the present inventions may employ three or more hard mask. (See, for example, FIGS. 4C and 4D). For example, in one illustrative embodiment, the first hard mask may be implemented as described above in connection with the embodiments illustrated in FIGS. 1 and 3 (first portion 432), the second hard mask may be employed to define a tunnel barrier and magnetic materials of the second portion 434 of the MTJ device, and a third hard mask may be employed to define a tunnel barrier, magnetic materials and electrically conductive electrode of a third portion 436 of the MTJ device. Further, in yet another illustrative embodiment, the first hard mask 114', 314' may be implemented as described above in connection with the embodiments illustrated in FIGS. 1 and 3, the second hard mask 118', 318' may be employed to define two tunnel barriers 108', 308' and two magnetic materials 110', 310' of the second portion 434 of the MTJ device, and a third hard mask 430 may be employed to define an electrically conductive electrode 104 of the third portion 436 of the MTJ device 400. All permutations and combinations are intended to fall within the scope of the present inventions.

It should be noted that one or more "soft" masks may be employed in conjunction with the two or more hard mask.

Figure 5A:
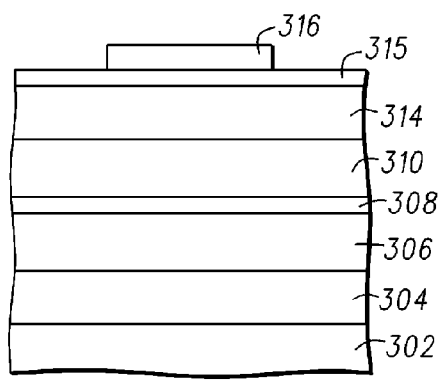
FIGS. 5A-5B are cross section diagrams of a semiconductor process in accordance with a fifth exemplary embodiment.
Figure 5B:
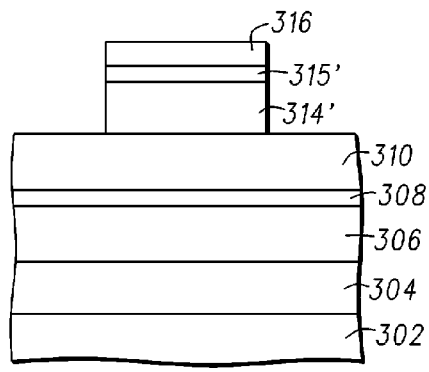
Figure 6A:
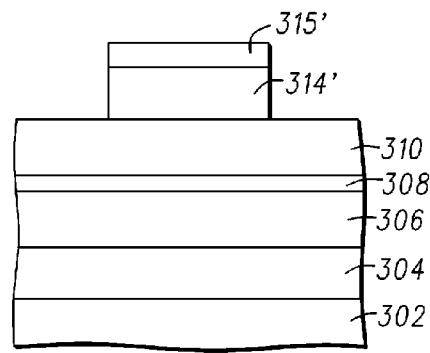
FIGS. 6A-6C are cross section diagrams of a semiconductor process in accordance with a sixth exemplary embodiment.
Figure 6B:
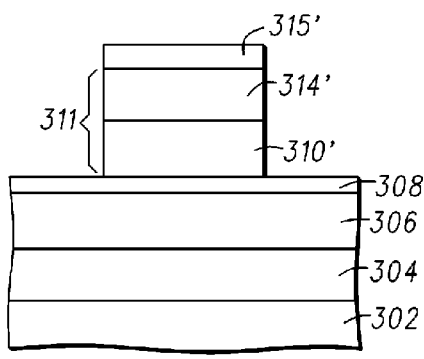
Figure 6C:
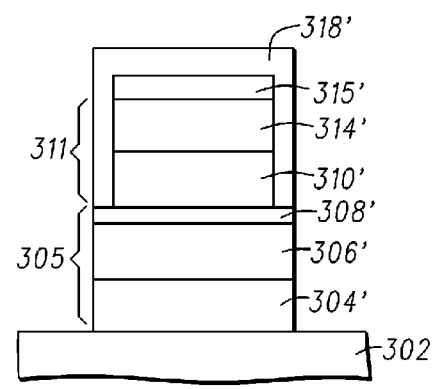

Moreover, it should be further noted, the patterned photo resist may be stripped or removed at multiple stages. For example, with reference to FIGS. 5A and 5B, in the metal hard mask—electrically conductive electrode 314 embodiment may be stripped or removed after etching the metal hard mask—electrically conductive electrode layers 314 which form or define the metal hard mask—electrically conductive electrode 314. (Compare, FIGS. 3C-3F). Indeed, in another embodiment, the photo-pattern assist layer 315 is not stripped or removed after etching the metal hard mask—electrically conductive electrode layers 314 to form or define the metal hard mask—electrically conductive electrode 314' (FIGS. 6A-6C).

Indeed, in one embodiment, a second or subsequent mask 118', 318' is not patterned via a photolithography process. For example, in one embodiment, the second or subsequent mask 118', 318' is formed via a self-aligning technique whereby the material of the second mask layer 118, 318 is deposited and/or the characteristics of the features and/or materials of the MTJ device 100, 300 (which may be impacted by surrounding structures, for example, neighboring MTJ devices of an array of MTJ devices) provide a self-aligning environment and the second or subsequent mask 118', 318' is not patterned via photolithography processes. As such, in this embodiment, the second/subsequent portion 105, 305 of the MTJ device 100, 300 is not defined by a photolithographically patterned second/subsequent mask 118', 318' (a mask which is patterned via a photolithography process as described above—for example, as illustrated in FIGS. 1G and 1H or FIGS. 3I and 3J).

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, many of those permutations and combinations will not be discussed and/or illustrated separately herein.

Figure 7:
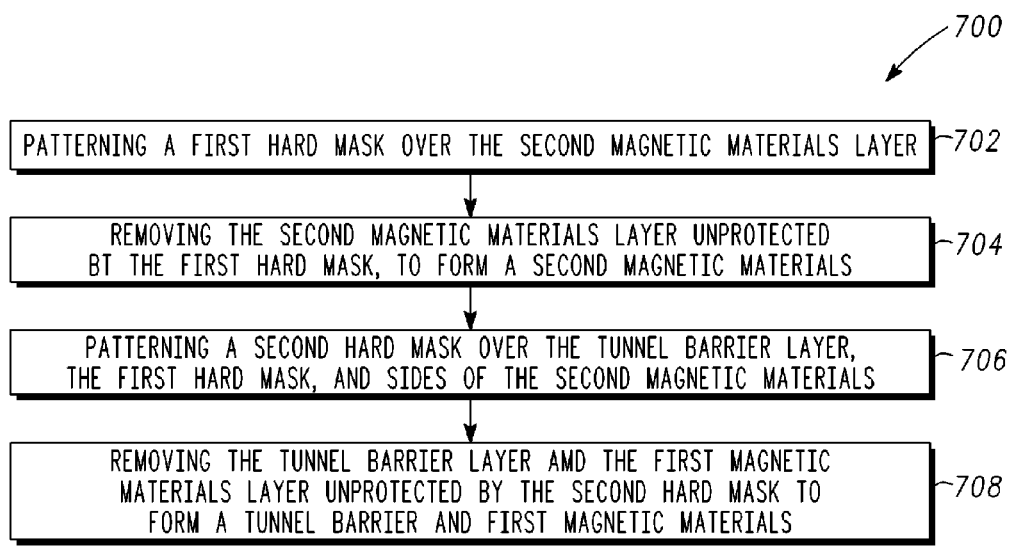
FIG. 7 is a flow chart of a method in accordance with one exemplary embodiment.
Figure 8:
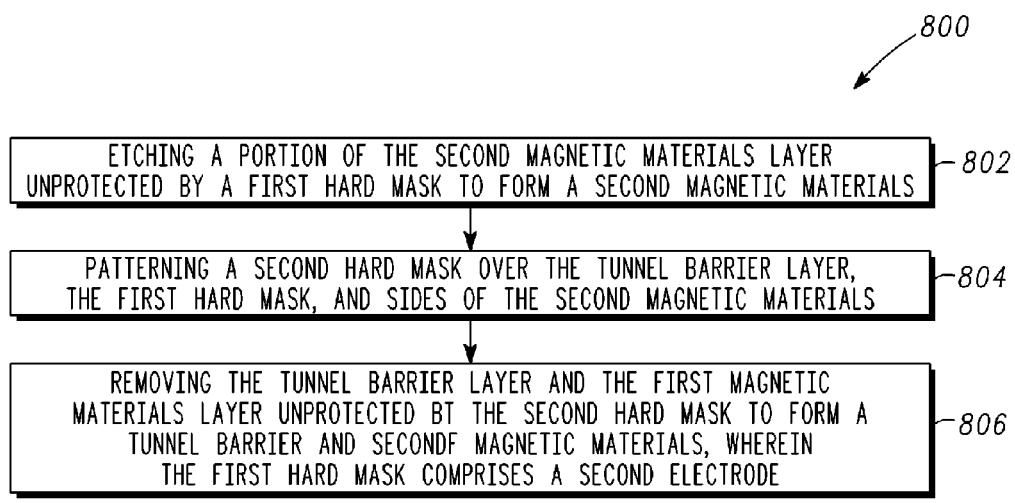
FIG. 8 is a flow chart of a method in accordance with another exemplary embodiment.

FIGS. 7 and 8 are flow charts that illustrate exemplary embodiments of a method of manufacturing a magnetoresistive-based device having a magnetic material layer formed over a first electrically conductive layer, the magnetic materials layers including a tunnel barrier layer formed between a first magnetic materials layer and a second magnetic materials layer. The various tasks performed in connection with methods 700 and 800 may be performed by software, hardware, firmware, or any combination thereof. For illustrative purposes, the following description of methods 700 and 800 may refer to elements mentioned above in connection with FIGS. 7 and 8. In practice, portions of methods 700 and 800 may be performed by different elements of the described system, e.g., a processor, a display element, or a data communication component. It should be appreciated that methods 700 and 800 may include any number of additional or alternative tasks, the tasks shown in FIGS. 7 and 8 need not be performed in the illustrated order, and methods 700 and 800 may be incorporated into a more comprehensive procedure or process having additional functionality not described in detail herein. Moreover, one or more of the tasks shown in FIGS. 7 and 8 could be omitted from an embodiment of the methods 700 and 800 as long as the intended overall functionality remains intact.

Referring to FIG. 7, the method 700 includes patterning a first hard mask over a second magnetic materials layer; removing the second magnetic materials layer unprotected by the first hard mask, to form a second magnetic materials; patterning a second hard mask over the tunnel barrier layer, the first hard mask, and sides of the second magnetic materials; and removing the tunnel barrier layer and the first magnetic materials layer unprotected by the second hard mask to form a tunnel barrier and first magnetic materials.

The method 800 of FIG. 8 includes etching a portion of the second magnetic materials layer unprotected by a first hard mask to form a second magnetic materials; patterning a second hard mask over the tunnel barrier layer, the first hard mask, and sides of the second magnetic materials; and removing the tunnel barrier layer and the first magnetic materials layer unprotected by the second hard mask to form a tunnel barrier and second magnetic materials, wherein the first hard mask comprises a second electrode Although the described exemplary embodiments disclosed herein are directed to various magnetoresistive-based devices and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of manufacturing a spin-torque magnetoresistive device, the method comprising:
   forming a first electrically conductive electrode layer over a substrate,
   forming at least one layer of first magnetic material over the first electrically conductive electrode;
   forming a first tunnel barrier layer over the at least one layer of first magnetic material;
   forming at least one layer of second magnetic material over the first tunnel barrier layer;
   forming a second electrically conductive electrode layer over the at least one layer of second magnetic material;
   forming a first hard mask over a portion of the second electrically conductive electrode layer;
   performing a first etch, after forming the first hard mask, through the second electrically conductive electrode layer and the at least one layer of second magnetic material to form a second electrically conductive electrode and provide sidewalls of the at least one layer of second magnetic material;
   forming a second hard mask over the second electrically conductive electrode and the sidewalls of the at least one layer of second magnetic material;
   performing a second etch, after forming the second hard mask, through the first tunnel barrier layer to form the first tunnel barrier, wherein the first tunnel barrier includes sidewalls;
   after performing the second etch, forming a third hard mask; and
   performing a third etch, after forming the third hard mask, through the first electrically conductive electrode layer to form the first electrically conductive electrode.

2. The method of claim 1 wherein forming the first, second and/or third hard masks include:
   depositing a hard mask layer, and
   patterning the hard mask layer using a patterned photo resist disposed thereon.

3. The method of claim 1 further including:
   forming an encapsulation material, prior to forming the second hard mask, on the: (i) sidewalls of the at least one layer of second magnetic material and (ii) a portion of the first tunnel barrier layer exposed by the first etch, wherein forming an encapsulation material includes:

depositing material on the (i) sidewalls of the at least one layer of second magnetic material and (ii) a portion of the first tunnel barrier layer exposed by the first etch, and thereafter, oxidizing the material; and wherein performing the second etch to form the first tunnel barrier further includes etching through (i) the encapsulation material on the first tunnel barrier layer and (ii) the first tunnel barrier layer.

4. The method of claim 1 wherein the first tunnel barrier layer includes a plurality of layers of magnesium and/or magnesium oxide.

5. The method of claim 1 further including:

forming a second tunnel barrier layer between (i) the at least one layer of second magnetic material and (ii) the second electrically conductive electrode layer, wherein performing the first etch further includes etching through the second tunnel barrier layer to form the second tunnel barrier.

6. The method of claim 5 further including:

forming at least one layer of third magnetic material between (i) the second tunnel barrier layer and (ii) the second electrically conductive electrode layer, wherein performing the first etch further includes etching through the at least one layer of third magnetic material to provide sidewalls of the at least one layer of third magnetic material.

7. The method of claim 1 wherein the at least one layer of first magnetic material and the at least one layer of second magnetic material comprise the same or different types of material.

8. The method of claim 7 wherein the types of material include Nickel (Ni), Iron (Fe), Cobalt (Co), Palladium (Pd), Magnesium (Mg), Manganese (Mn) and alloys thereof.

9. The method of claim 1 wherein performing the second etch or performing the third etch further includes etching through the at least one layer of first magnetic material to provide sidewalls of the at least one layer of first magnetic material.

10. The method of claim 9 further including oxidizing the sidewalls of the at least one layer of first magnetic material prior to performing the third etch.

11. The method of claim 1 wherein forming a third hard mask further includes forming the third hard mask over the sidewalls of the first tunnel barrier.

12. A method of manufacturing a spin-torque magnetoresistive device, the method comprising:

forming a first electrically conductive electrode layer over a substrate, forming at least one layer of first magnetic material over the first electrically conductive electrode;

forming a first tunnel barrier layer over the at least one layer of first magnetic material;

forming at least one layer of second magnetic material over the first tunnel barrier layer;

forming a metal hard mask layer over the at least one layer of second magnetic material;

performing a first etch through the metal hard mask layer to form a metal hard mask-second electrically conductive electrode;

performing a second etch through the at least one layer of second magnetic material using metal hard mask-second electrically conductive electrode to provide sidewalls of the at least one layer of second magnetic material;

forming a second hard mask over (i) the metal hard mask-second electrically conductive electrode and (ii) the sidewalls of the at least one layer of second magnetic material;

performing a second etch, after forming the second hard mask, through the first tunnel barrier layer to form the first tunnel barrier, wherein the first tunnel barrier includes sidewalls;

after performing the second etch, forming a third hard mask; and performing a third etch through the first electrically conductive electrode layer to form the first electrically conductive electrode.

13. The method of claim 12 further including:

forming an encapsulation material, prior to forming the second hard mask, on the: (i) sidewalls of the at least one layer of second magnetic material, and wherein performing the second etch further includes etching through the encapsulation material and the first tunnel barrier layer to form the first tunnel barrier.

14. The method of claim 12 further including:

forming a second tunnel barrier layer between (i) the at least one layer of second magnetic material and (ii) the metal hard mask layer, wherein performing the first etch further includes etching through the second tunnel barrier layer to form the second tunnel barrier.

15. The method of claim 12 further including:

forming at least one layer of third magnetic material between (i) the second tunnel barrier layer and (ii) the metal hard mask layer, wherein performing the first etch further includes etching through the at least one layer of third magnetic material to provide sidewalls of the at least one layer of third magnetic material.

16. The method of claim 12 wherein the at least one layer of first magnetic material and the at least one layer of second magnetic material comprise the same or different types of material.

17. The method of claim 16 wherein the types of material include Nickel (Ni), Iron (Fe), Cobalt (Co), Palladium (Pd), Magnesium (Mg), Manganese (Mn) and alloys thereof.

18. The method of claim 12 wherein performing the second etch or performing the third etch further includes etching through the at least one layer of first magnetic material to provide sidewalls of the at least one layer of first magnetic material.

19. The method of claim 12 wherein forming the second and/or third hard masks include:

depositing a hard mask layer, and patterning the hard mask layer using a patterned photo resist disposed thereon.

20. A method of manufacturing a spin-torque magnetoresistive device from: (i) a first electrically conductive electrode layer disposed over a substrate, (ii) at least one layer of first magnetic material disposed over the first electrically conductive electrode, (iii) a first tunnel barrier layer disposed over the at least one layer of first magnetic material, and (iv) at least one layer of second magnetic material over the first tunnel barrier layer, the method comprising:

forming a metal hard mask layer over the at least one layer of second magnetic material performing a first etch through the metal hard mask layer to form a metal hard mask-second electrically conductive electrode;

performing a second etch through the at least one layer of second magnetic material using metal hard mask-second electrically conductive electrode to provide sidewalls of the at least one layer of second magnetic material;

forming a second hard mask over (i) the metal hard mask-second electrically conductive electrode and (ii) the sidewalls of the at least one layer of second magnetic material;

performing a second etch through the first tunnel barrier layer using the second hard mask to form the first tunnel barrier, wherein the first tunnel barrier includes sidewalls;

forming a third hard mask over the sidewalls of the first tunnel barrier; and performing a third etch through the first electrically conductive electrode layer using the third hard mask to form the first electrically conductive electrode.

21. The method of claim 20 wherein performing the third etch further includes etching through the at least one layer of first magnetic material to provide sidewalls of the at least one layer of first magnetic material.

22. The method of claim 20 wherein forming the second and/or third hard masks include:

depositing a hard mask layer, and patterning the hard mask layer using a patterned photo resist disposed thereon.

* * * * *